US011381221B2

(12) United States Patent
McHugh et al.

(10) Patent No.: US 11,381,221 B2
(45) Date of Patent: Jul. 5, 2022

(54) TRANSVERSELY-EXCITED BULK ACOUSTIC RESONATOR SPLIT LADDER FILTER

(71) Applicant: Resonant Inc., Goleta, CA (US)

(72) Inventors: Sean McHugh, Santa Barbara, CA (US); Gregory L. Hey-Shipton, Santa Barbara, CA (US); Garrett Williams, San Mateo, CA (US)

(73) Assignee: Resonant Inc., Austin, TX (US)

( * ) Notice: Subject to any disclaimer, the term of this patent is extended or adjusted under 35 U.S.C. 154(b) by 51 days.

(21) Appl. No.: 17/096,841

(22) Filed: Nov. 12, 2020

(65) Prior Publication Data
US 2021/0067140 A1 Mar. 4, 2021

Related U.S. Application Data

(63) Continuation of application No. 16/727,304, filed on Dec. 26, 2019, now Pat. No. 10,917,072.
(Continued)

(51) Int. Cl.
*H03H 9/64* (2006.01)
*H03H 9/02* (2006.01)
(Continued)

(52) U.S. Cl.
CPC ...... *H03H 9/6483* (2013.01); *H03H 9/02559* (2013.01); *H03H 9/605* (2013.01); *H03H 9/725* (2013.01)

(58) Field of Classification Search
CPC .. H03H 9/6483; H03H 9/02559; H03H 9/605; H03H 9/725; H03H 9/02228; H03H 9/0523; H03H 9/059
(Continued)

(56) References Cited

U.S. PATENT DOCUMENTS 6,540,827 B1 4/2003 Levy et al.
7,463,118 B2 12/2008 Jacobsen
(Continued)

FOREIGN PATENT DOCUMENTS

WO 2016017104 2/2016
WO 2018003273 A1 1/2018

OTHER PUBLICATIONS

T. Takai, H. Iwamoto, et al., "I.H.P. Saw Technology and its Application to Microacoustic Components (Invited)." 2017 IEEE International Ultrasonics Symposium, Sep. 6-9, 2017. pp. 1-8.
(Continued)

*Primary Examiner* — Rakesh B Patel
*Assistant Examiner* — Jorge L Salazar, Jr.
(74) *Attorney, Agent, or Firm* — Socal IP Law Group LLP; Angelo Gaz

(57) ABSTRACT

Filter devices. A first chip includes a first interdigital transducer (IDT) of a first acoustic resonator formed on a surface of a first piezoelectric wafer having a first thickness, interleaved fingers of the first IDT disposed on a portion of the first piezoelectric wafer spanning a first cavity in a first base. A second chip includes a second IDT of a second acoustic resonator formed on a surface of a second piezoelectric wafer having a second thickness less than the first thickness, interleaved fingers of the second IDT disposed on a portion of the second piezoelectric wafer spanning a second cavity in a second base. A circuit card coupled to the first chip and the second chip includes at least one conductor for making an electrical connection between the first IDT and the second IDT.

19 Claims, 12 Drawing Sheets

Related U.S. Application Data

(60) Provisional application No. 62/865,798, filed on Jun. 24, 2019.

(51) Int. Cl.
*H03H 9/60* (2006.01)
*H03H 9/72* (2006.01)

(58) Field of Classification Search
USPC .......................................... 333/133, 193–196
See application file for complete search history.

(56) References Cited

U.S. PATENT DOCUMENTS

| | | | |
|---|---|---|---|
| 7,535,152 | B2 | 5/2009 | Ogami et al. |
| 7,684,109 | B2 | 3/2010 | Godshalk et al. |
| 7,868,519 | B2 | 1/2011 | Umeda |
| 8,278,802 | B1 | 10/2012 | Lee et al. |
| 8,829,766 | B2 | 9/2014 | Milyutin et al. |
| 8,932,686 | B2 | 1/2015 | Hayakawa et al. |
| 9,219,466 | B2 | 12/2015 | Meltaus et al. |
| 9,276,557 | B1 | 3/2016 | Nordquist et al. |
| 9,369,105 | B1 | 6/2016 | Li |
| 9,425,765 | B2 | 8/2016 | Rinaldi |
| 9,525,398 | B1 | 12/2016 | Olsson |
| 9,780,759 | B2 | 10/2017 | Kimura et al. |
| 10,491,192 | B1 | 11/2019 | Plesski et al. |
| 10,601,392 | B2 | 3/2020 | Plesski et al. |
| 10,637,438 | B2 | 4/2020 | Garcia et al. |
| 10,756,697 | B2 | 8/2020 | Plesski et al. |
| 10,790,802 | B2 | 9/2020 | Yantchev et al. |
| 10,797,675 | B2 | 10/2020 | Plesski |
| 2002/0158714 | A1 | 10/2002 | Kaitila et al. |
| 2004/0261250 | A1 | 12/2004 | Kadota et al. |
| 2011/0109196 | A1 | 5/2011 | Goto |
| 2013/0234805 | A1 | 9/2013 | Takahashi |
| 2014/0145556 | A1 | 5/2014 | Kadota |
| 2014/0151151 | A1 | 6/2014 | Reinhardt |
| 2015/0319537 | A1 | 11/2015 | Perois et al. |
| 2015/0333730 | A1* | 11/2015 | Meltaus ................. H03H 9/175 310/321 |
| 2016/0182009 | A1 | 6/2016 | Bhattacharjee |
| 2017/0063332 | A1 | 3/2017 | Gilbert et al. |
| 2017/0179928 | A1 | 6/2017 | Raihn et al. |
| 2017/0214387 | A1 | 7/2017 | Burak et al. |
| 2017/0222622 | A1 | 8/2017 | Solal et al. |
| 2018/0005950 | A1* | 1/2018 | Watanabe ........... H01L 23/5389 |
| 2019/0068164 | A1 | 2/2019 | Houlden et al. |
| 2019/0131953 | A1 | 5/2019 | Gong |
| 2019/0273480 | A1 | 9/2019 | Lin |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

USPTO/ISA, International Search Report and Written Opinion for PCT Application No. PCT/US2020/45654 dated Oct. 29, 2020.

* cited by examiner

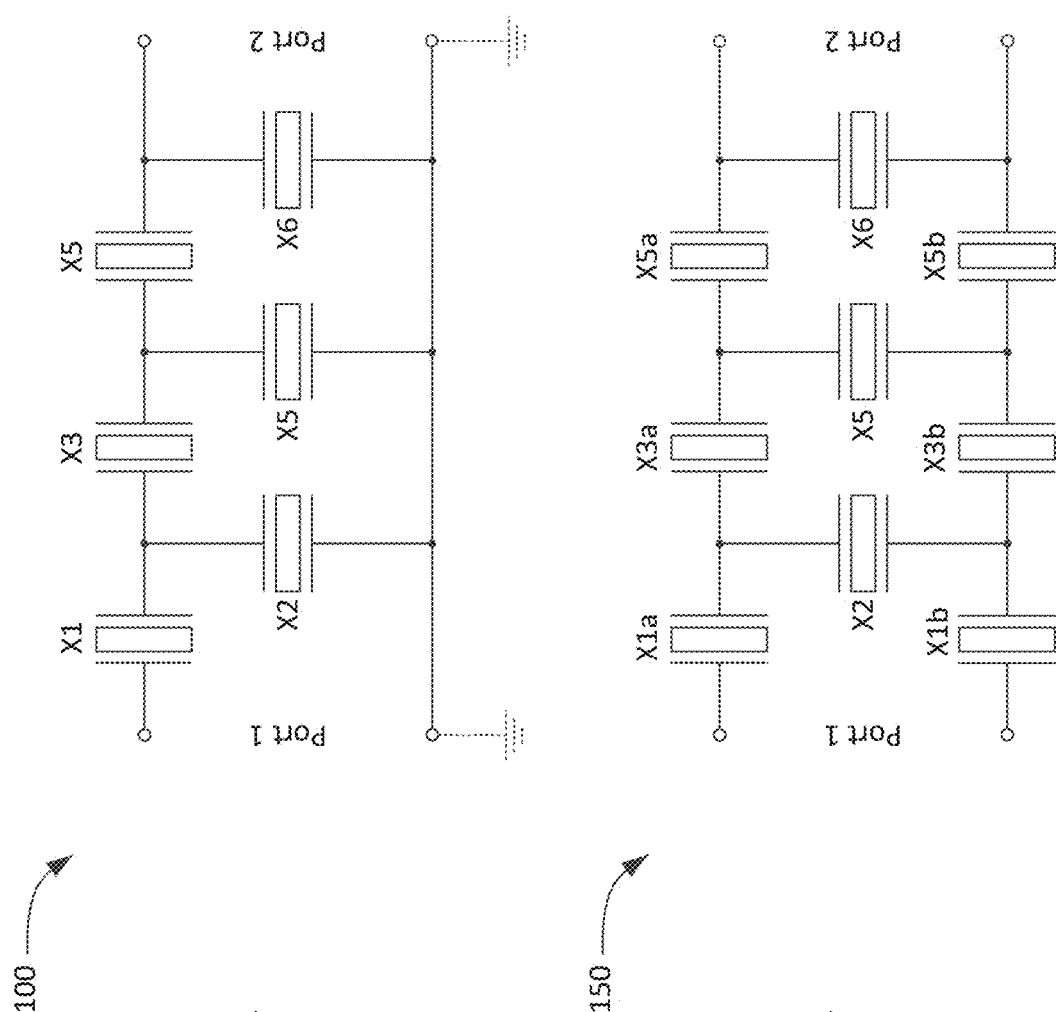

TRANSVERSELY-EXCITED BULK ACOUSTIC RESONATOR SPLIT LADDER FILTER

RELATED APPLICATION INFORMATION

This patent is a continuation of application Ser. No. 16/727,304, filed Dec. 26, 2019, entitled SPLIT LADDER ACOUSTIC WAVE FILTERS, which claims priority from provisional patent application 62/865,798, filed Jun. 24, 2019, entitled SPLIT LADDER FILTERS, which are incorporated herein by reference.

This application is related to U.S. Pat. No. 10,491,192 entitled TRANSVERSELY-EXCITED FILM BULK ACOUSTIC RESONATOR and U.S. Pat. No. 10,601,392, entitled SOLIDLY-MOUNTED TRANSVERSELY-EXCITED FILM BULK ACOUSTIC RESONATOR.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low insertion loss and "stop" means block or substantially attenuate. The range of frequencies passed by a filter is referred to as the "passband" of the filter. The range of frequencies stopped by such a filter is referred to as the "stopband" of the filter. A typical RF filter has at least one passband and at least one stopband. Specific requirements on a passband or stopband depend on the specific application. For example, a "passband" may be defined as a frequency range where the insertion loss of a filter is less than a defined value such as 1 dB, 2 dB, or 3 dB. A "stopband" may be defined as a frequency range where the insertion loss of a filter is greater than a defined value such as 20 dB, 30 dB, 40 dB, or greater depending on application.

RF filters are used in communications systems where information is transmitted over wireless links. For example, RF filters may be found in the RF front ends of base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

DESCRIPTION OF THE DRAWINGS

FIG. 1A is a schematic diagram of an exemplary RF ladder filter circuit incorporating acoustic wave resonators.

FIG. 1B is a schematic diagram of an alternative implementation of an RF ladder filter circuit incorporating acoustic wave resonators.

Figure 2A:
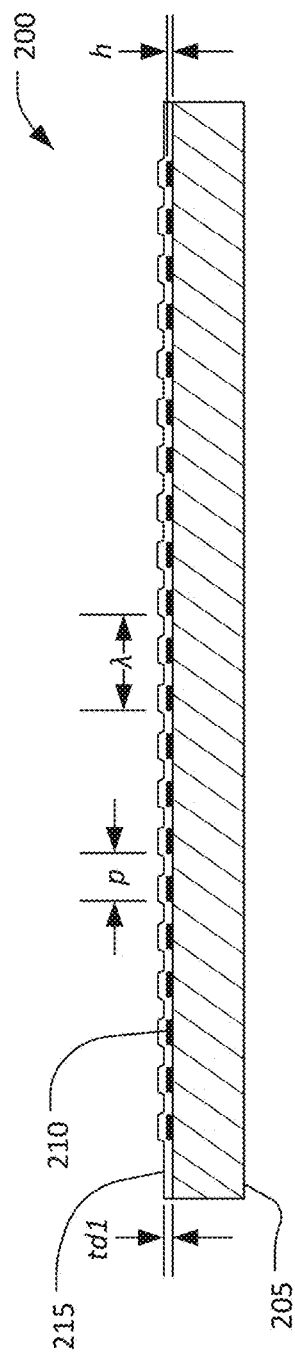
FIG. 2A is a simplified schematic cross-sectional view of a first acoustic wave resonator.

Throughout this description, elements appearing in figures are assigned three-digit reference designators, where the two least significant digits are specific to the element and the one or two most significant digit is the figure number where the element is first introduced. An element that is not described in conjunction with a figure may be presumed to have the same characteristics and function as a previously described element having the same reference designator.

DETAILED DESCRIPTION

Description of Apparatus

FIG. 1A shows a simplified schematic circuit diagram of an exemplary RF filter circuit 100 incorporating six acoustic wave resonators, labeled X1 through X6, arranged in what is commonly called a "ladder" configuration. A ladder filter of this configuration is commonly used for band-pass filters in communications devices. The filter circuit 100 may be, for example, a transmit filter or a receive filter for incorporation into a communications device. The filter circuit 100 is a two-port network where one terminal of each port is typically connected to a signal ground. The filter circuit 100 includes three series resonators (X1, X3, and X5) connected in series between a first port (Port 1) and second port (Port 2). Either port may be the input to the filter, with the other port being the output. The filter circuit 100 includes three shunt resonators (X2, X4, and X6). Each shunt resonator is connected between ground and either a junction of adjacent series resonators or the input or output port. The schematic diagram of FIG. 1A is simplified in that passive components, such as the inductances inherent in the conductors interconnecting the resonators, are not shown. The use of six acoustic wave resonators, three series resonators, and three shunt resonators is exemplary. A band-pass filter circuit may include more than, or fewer than, six resonators and more than, or fewer than, three series resonators and three shunt resonators.

FIG. 1B shows a simplified schematic circuit diagram of an alternative RF filter circuit 150. The filter circuit 150 is a two-port network where the signals at each port are balanced, which is to say the signal at the two terminals of each port are nominally equal in amplitude and separated by 180 degrees in phase. For the purposes of this patent, the RF filter circuit 150 is considered a ladder filter. The resonators X1a, X1b, X3a, X3b, X5a, and X5b are considered series resonators, and the resonators X2, X4, and X6 are considered shunt resonators. The ladder filter circuit 150 is not commonly used and all of the subsequent examples in this patent assume the ladder filter configuration of FIG. 1A.

Each acoustic wave resonator X1 to X6 may be a bulk acoustic wave (BAW) resonator, a film bulk acoustic wave (FBAW) resonator, a surface acoustic wave (SAW) resonator, a temperature compensated surface acoustic wave resonator (TC-SAW), a bonded wafer acoustic resonator, a transversely-excited film bulk acoustic resonator (XBAR) as described in application Ser. No. 16/230,443, a solidly-mounted transversely-excited film bulk acoustic resonator (SM-XBAR) as described in application Ser. No. 16/438,141, or some other type of acoustic wave resonator. In current filters of the acoustic wave resonators are typically the same type of resonator.

Each acoustic wave resonator exhibits very high admittance at a resonance frequency and very low admittance at an anti-resonance frequency higher than the resonance frequency. In simplified terms, each resonator is approximately a short circuit at its resonance frequency and an open circuit at its anti-resonance frequency. Thus, the transmission between Port 1 and Port 2 of the band-pass filter circuits 100 and 150 is very low at the resonance frequencies of the shunt resonators and the anti-resonance frequencies of the series resonators. In a typical ladder band-pass filter, the resonance frequencies of shunt resonators are less than a lower edge of the filter passband to create a stopband at frequencies below the passband. The anti-resonance frequencies of shut resonators typically fall within the passband of the filter. Conversely, the anti-resonance frequencies of series resonators are greater than an upper edge of the passband to create a stopband at frequencies above the passband. The resonance frequencies of series resonators typically fall within the passband of the filter. In some designs, one or more shunt resonators may have resonance frequencies higher than the upper edge of the passband.

A filter device, such as the band-pass filter circuits 100 and 150, including acoustic wave resonators is traditionally implemented using multiple layers of materials deposited on, bonded to, or otherwise formed on a substrate. The substrate and the sequence of material layers are commonly referred to as the "stack" used to form the acoustic wave resonators and the filter device. In this patent, the term "material stack" means an ordered sequence of material layers formed on a substrate, where the substrate is considered a part of the material stack. The term "element" means the substrate or one of the layers in a material stack. At least one element in the material stack (i.e. either the substrate or a layer) is a piezoelectric material such as quartz, lithium niobate, lithium tantalate, lanthanum gallium silicate, gallium nitride, or aluminum nitride. When the piezoelectric material is a single crystal, the orientations of the X, Y, and Z crystalline axes are known and consistent. One or more layers in the material stack, such as one or more conductor layers and/or dielectric layers, may be patterned using photolithographic methods, such that not all elements of the material stack are present at every point on the acoustic wave device.

FIG. 2A is a schematic cross-section view of first exemplary acoustic wave resonator 200. The first acoustic wave resonator 200 will be referred to herein as a "non-bonded SAW resonator" (as opposed to a "bonded-wafer resonator to be described in conjunction with FIG. 2B). A "non-bonded SAW resonator" is characterized by a conductor pattern 210 formed on a piezoelectric plate 205 that is not bonded to a thicker base or substrate. This term encompasses both temperature-compensated and non-temperature compensated SAW resonators. The conductor pattern 210 including an interdigital transducer (IDT) formed on a surface of the plate 205 of single-crystal piezoelectric material. Dimension p is the pitch, or conductor-to-conductor spacing, of the fingers of the IDT. The dimension $\lambda=2p$ is the wavelength of the acoustic wave that propagates across the surface of the piezoelectric plate 205. When multiple non-bonded SAW resonators 200 are combined to form a filter device, the resonance frequencies of various resonators are set by selecting the pitch of each resonator. The dimension h is the thickness of the conductor pattern. A dielectric layer 215, having a thickness td1, may be deposited over and between the conductors of the conductor pattern. The dielectric layer 215 may be, for example, a thin passivation layer to seal and protect the electrode pattern and the surface of the piezoelectric plate 205. In a TC-SAW resonator, the dielectric layer 215 may be a relatively thick layer of, for example, SiO2 used to reduce the temperature coefficient of frequency of the resonator.

The material stack for a non-bonded SAW resonator, such as the first exemplary acoustic wave resonator 200, includes the piezoelectric plate 205, the conductor pattern 210 and the dielectric layer 215. The piezoelectric plate 205 is defined by a material type, thickness, and orientation of the crystalline axes of the piezoelectric material. The conductor pattern 210 is defined by the thickness h and material, which may be, for example, aluminum, copper, gold, molybdenum, tungsten, and alloys and combinations thereof. The dielectric layer 215 is defined by the thickness td1 and material, which may be, for example, silicon dioxide or silicon nitride. When multiple non-bonded SAW resonators 200 are incorporated into a filter device, the material stack may include additional layers not shown in FIG. 2A. For example, filter devices commonly include a second metal layer to increase the conductivity of conductors interconnecting the resonators, and may include additional dielectric layers and/or a third metal layer of thick gold or solder to form bumps to interconnect the filter with an external circuit card.

Figure 2B:
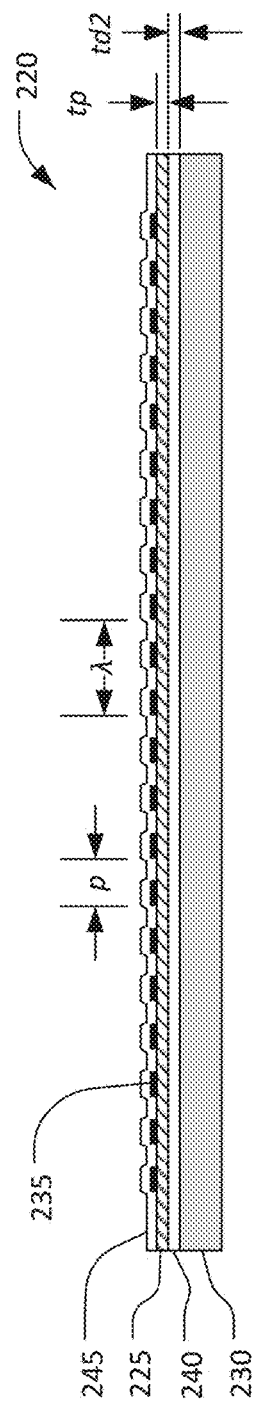
FIG. 2B is a simplified schematic cross-sectional view of a second acoustic wave resonator.

FIG. 2B is a schematic cross-section view of a second exemplary acoustic wave resonator 220. The second acoustic wave resonator 220 will be referred to herein as a "bonded-wafer resonator." A "bonded-wafer resonator" is characterized by a thin wafer or plate 225 of single-crystal piezoelectric material bonded to a non-piezoelectric base 230. The thin wafer or plate 225 of single-crystal piezoelectric material may be bonded to the non-piezoelectric base 230 directly, or indirectly by means of one or more intermediate dielectric layers 240. The second acoustic wave resonator 220 may be, for example, a bonded-wafer SAW resonator, an IHP (Incredibly High Performance) SAW resonator, or a plate wave resonator. The second acoustic wave resonator 220 includes a conductor pattern 235 including an IDT formed on a surface of the thin wafer 225 of single-crystal piezoelectric material. The thickness of the conductor pattern is dimension h (see FIG. 2A). Dimension tp is the thickness of the wafer 225 of piezoelectric material. Dimension p is the pitch, or conductor-to-conductor spacing, of the fingers of the IDT. The dimension $\lambda=2p$ is the wavelength of the acoustic wave that propagates across the surface of or within the piezoelectric wafer 225. When multiple bonded-wafer resonators 220 are combined to form a filter device, the resonance frequencies of various resonators are set by selecting the IDT pitch of each resonator. A dielectric layer 245 of thickness td1 (see FIG. 2A) may be deposited over and between the conductors of the conductor pattern as previously described. A second dielectric layer 240, having a thickness td2, may be disposed between the wafer 225 and the base 230. In some cases, two dielectric layers may be disposed between the wafer 225 and the base 230.

The material stack for a bonded-wafer resonator, such as the second exemplary acoustic wave resonator 220, includes the base 230, the underlying dielectric layer or layers 240, if present, the piezoelectric wafer 225, the conductor pattern 235 and the dielectric layer 245. The base 230 is defined by a material and thickness. The underlying dielectric layers 240 are defined by a material type and thickness td2 of each layer. The piezoelectric wafer 225 is defined by a material type, thickness tp, and orientation of the crystalline axes of the piezoelectric material. The conductor pattern 235 is defined by the thickness h (See FIG. 2A) and material. The dielectric layer 245 is defined by the thickness td1 and material. When multiple bonded-wafer resonators 220 are incorporated into a filter, the material stack may include additional layers as previously described.

Figure 3A:
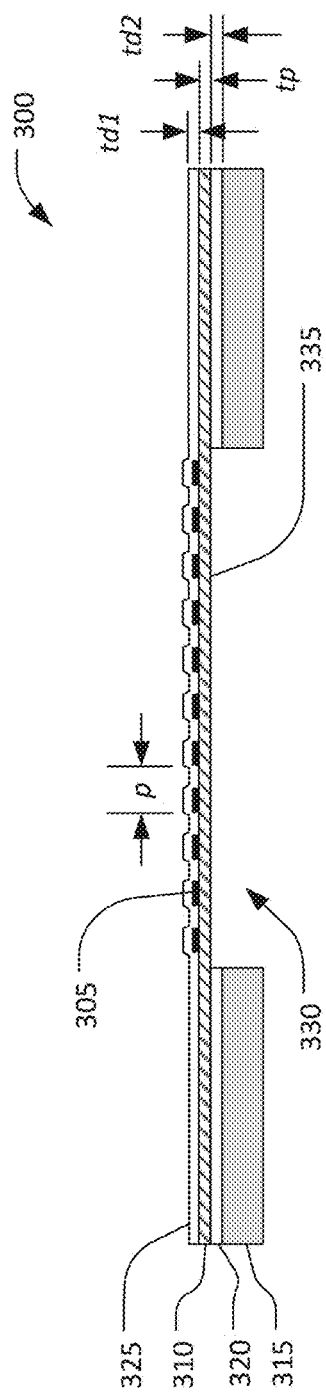
FIG. 3A is a simplified schematic cross-sectional view of a third acoustic wave resonator.

FIG. 3A is a schematic cross-section view of a third exemplary acoustic wave resonator 300. The third acoustic wave resonator 300 will be referred to herein as a "floating-diaphragm resonator". A floating diaphragm resonator is characterized by a thin diaphragm 335 of single-crystal piezoelectric material floating over a cavity 330 formed in a non-piezoelectric base 315. The third acoustic wave resonator 300 may be, for example, an XBAR resonator as described in application Ser. No. 16/230,443 or some other type of acoustic resonator. The third acoustic wave resonator 300 includes a conductor pattern 305 including an IDT formed on a surface of a thin wafer 310 of single-crystal piezoelectric material, which is attached or bonded to the non-piezoelectric base 315. When the third acoustic wave resonator is a plate wave resonator, the conductor pattern may include Bragg reflectors (not shown in FIG. 3A). A dielectric layer 320 or layers may be present between the wafer 310 and the base 315. The cavity 330 is formed in the base 315 and dielectric layer(s) 320, if present, such that a portion of the wafer 310 forms the diaphragm 335 spanning the cavity 330. The fingers of the IDT are disposed on the diaphragm 335. A dielectric layer 325 may be deposited over and between the fingers of the conductor pattern 305.

The material stack for a floating diaphragm resonator, such as the third exemplary acoustic wave resonator 300, includes the base 315, the underlying dielectric layer or layers 320, if present, the piezoelectric wafer 310, the conductor pattern 305 and the dielectric layer 325. The base 315 is defined by a material and thickness. The underlying dielectric layers 320 are defined by a material type and thickness td2 of each layer. The piezoelectric wafer 310 is defined by a material type, thickness tp, and orientation of the crystalline axes of the piezoelectric material. The conductor pattern 305 is defined by its thickness and material. The dielectric layer 325 is defined by the thickness td1 and material. When multiple acoustic wave resonators 300 are incorporated into a filter, the material stack may include additional layers as previously described.

Figure 3B:
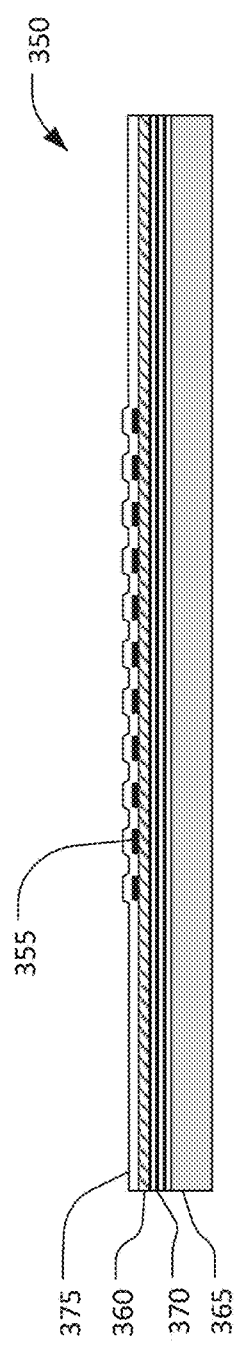
FIG. 3B a simplified schematic cross-sectional view of a fourth acoustic wave resonator FIG. 4A a simplified schematic cross-sectional view of a fifth acoustic wave resonator.

FIG. 3B is a schematic cross-section view of a fourth exemplary acoustic wave resonator 350. The fourth acoustic wave resonator 350 will be referred to herein as a "solidly-mounted membrane resonator." A solidly mounted membrane resonator is characterized by a conductor pattern 355 including an IDT formed on a surface of a thin membrane 360 of single-crystal piezoelectric material supported by a non-piezoelectric base 365, with an acoustic Bragg reflector 370 sandwiched between the membrane 360 and the base 365. The acoustic Bragg reflector 370 includes multiple layers alternating between a first material having high acoustic impedance and a second material having low acoustic impedance. The acoustic Bragg reflector 370 is configured to reflect and confine acoustic waves generated with the membrane 360. A dielectric layer 375 may be deposited over and between the fingers of the conductor pattern 355.

The material stack for a solidly mounted membrane resonator 350 includes the base 365, the acoustic Bragg reflector 370, the piezoelectric membrane 360, the conductor pattern 355 and the dielectric layer 375. The base 365 is defined by a material and thickness. The acoustic Bragg reflector 370 is defined by the first and second material types, the number of layers, and the thickness of each layer. The piezoelectric membrane 360 is defined by a material type, thickness tp, and orientation of the crystalline axes of the piezoelectric material. The conductor pattern 355 is defined by its thickness and material. The dielectric layer 375 is defined by the thickness td1 and material. When multiple solidly mounted membrane resonators are incorporated into a filter device, the material stack may include additional layers as previously described.

Figure 4A:
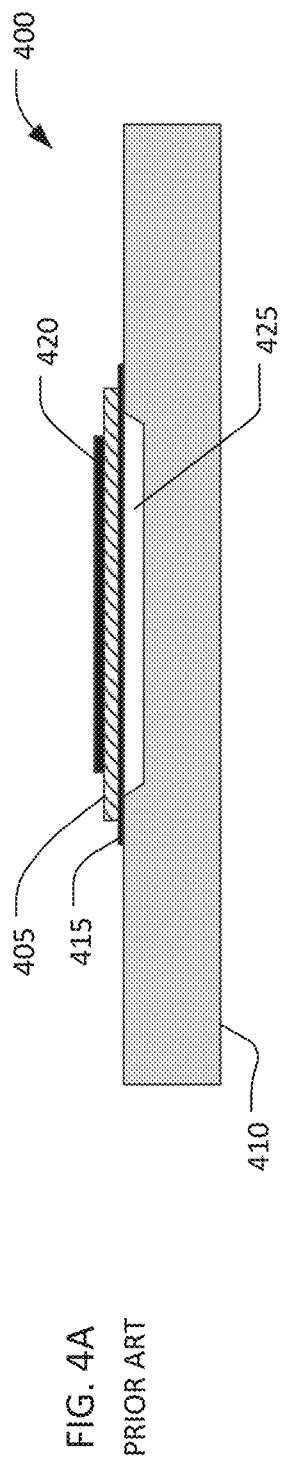
FIG. 4B a simplified schematic cross-sectional view of a sixth acoustic wave resonator.

FIG. 4A is a schematic cross-section view of a fifth exemplary acoustic wave resonator 400. The fifth acoustic wave resonator 400 is a film bulk acoustic resonator (FBAR). The fifth acoustic wave resonator 400 includes a thin wafer or film 405 of single-crystal piezoelectric material sandwiched between upper and lower conductors 420 and 415, respectively. This sandwich is support by a non-piezoelectric base 410. A cavity 425 is formed in the base 410 such that a portion of the sandwich 415/405/420 forms a diaphragm spanning the cavity 425.

The material stack for the FBAR 400 includes the base 410, the lower conductor layer 415, the piezoelectric wafer or film 405, and the upper conductor layer 420. The base 410 is defined by a material and thickness. The lower conductor layer 415 is defined by a material type and thickness. The piezoelectric wafer or film 405 is defined by a material type, thickness, and orientation of the crystalline axes of the piezoelectric material. The upper conductor layer 420 is defined by its thickness and material. When multiple FBARs 400 are incorporated into a filter, the material stack may include additional layers as previously described.

Figure 4B:
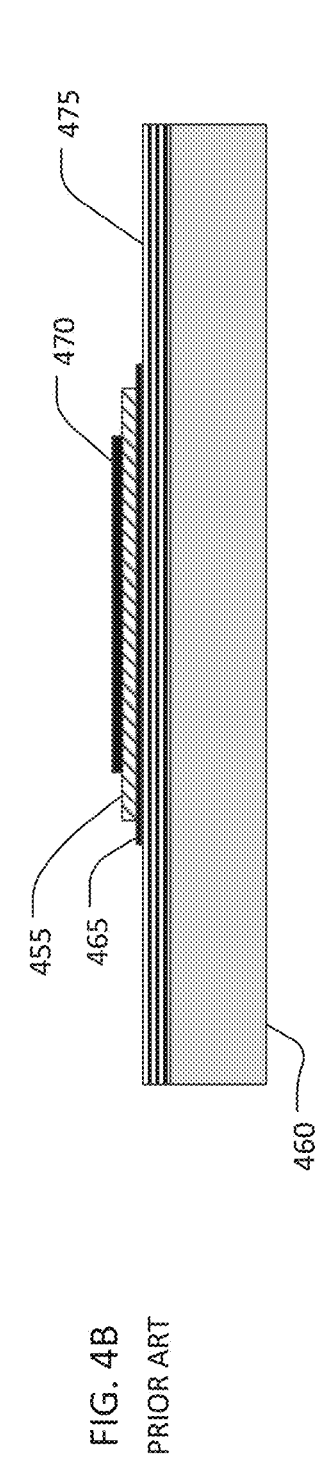

FIG. 4B is a schematic cross-section view of a sixth exemplary acoustic wave resonator 450. The sixth acoustic wave resonator will be referred to herein as a "solidly-mounted film bulk acoustic resonator" (SM-FBAR). The sixth acoustic wave resonator 450 includes a thin wafer or film 455 of single-crystal piezoelectric material sandwiched between upper and lower conductors 470 and 465, respectively. This sandwich is support by a non-piezoelectric base 460. An acoustic Bragg reflector 475 is sandwiched between the sandwich 470/455/465 and the base 460. The acoustic Bragg reflector 475 includes multiple layers alternating between a first material having high acoustic impedance and a second material having low acoustic impedance. The acoustic Bragg reflector 475 is configured to reflect and confine acoustic waves generated with the sandwich 470/455/465.

The material stack for the SM-FBAR 450 includes the base 460, the acoustic Bragg reflector 475, the lower conductor layer 465, the piezoelectric wafer or film 455, and the upper conductor layer 470. The base 460 is defined by a material and thickness. The acoustic Bragg reflector 475 is defined by the first and second material types, the number of layers, and the thickness of each layer. The lower conductor layer 465 is defined by a material type and thickness. The piezoelectric wafer or film 455 is defined by a material type, thickness, and orientation of the crystalline axes of the piezoelectric material. The upper conductor layer 470 is defined by its thickness and material. When multiple SM-FBARs 450 are incorporated into a filter, the material stack may include additional layers as previously described.

The acoustic resonators shown in FIG. 2A through FIG. 4B are not an all-inclusive list of acoustic resonator types. Other types of acoustic resonators, having other material stacks, may be used in filters. Further, the cross-sectional views of FIG. 2A through FIG. 4B do not necessarily show all layers in the respective material stacks. Additional layers may be present, for example, to promote adhesion between other layers, prevent chemical interaction between other layers, or to passivate and protect other layers.

Figure 5:
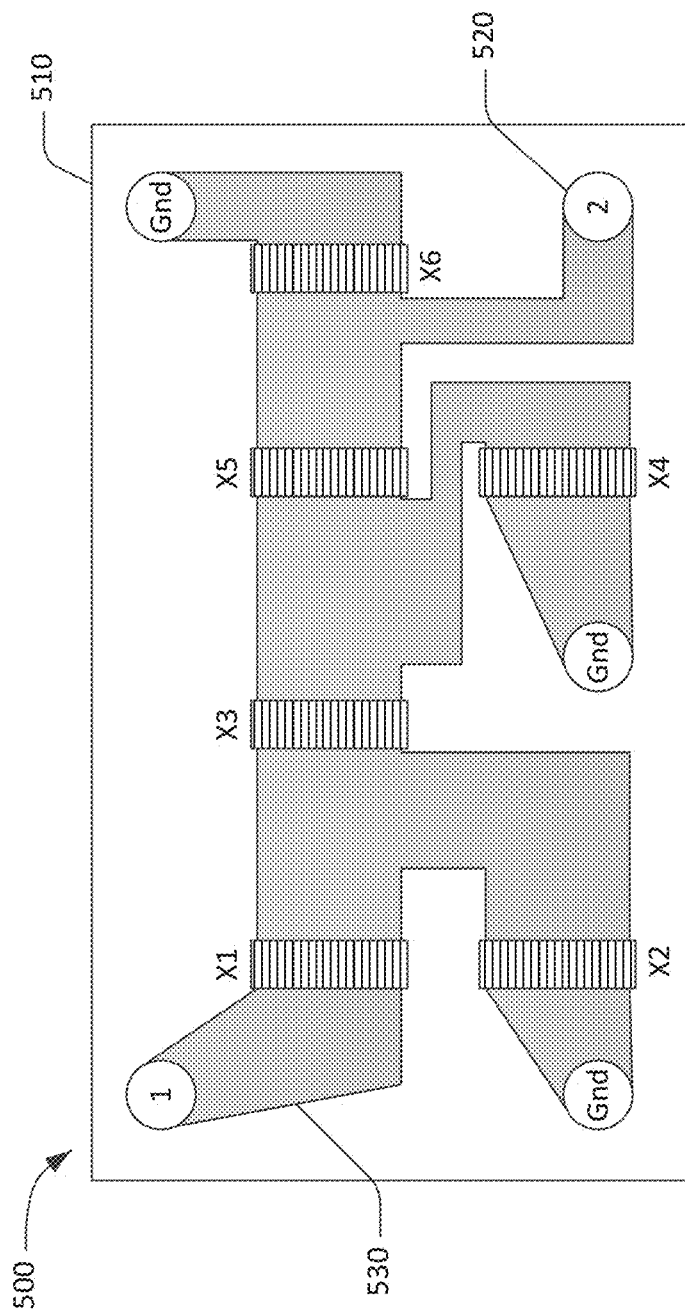
FIG. 5 is a simplified schematic plan view of a traditional ladder filter.

FIG. 5 is an exemplary schematic plan view of a conventional implementation of a band-pass filter 500, which has the same schematic diagram as the band-pass filter circuit 100 of FIG. In the filter 500, all six acoustic wave resonators X1-X6 are formed on a common chip 510. All of the acoustic wave resonators X1 to X6 may be non-bonded SAW resonators, bonded wafer resonators, floating diaphragm resonators, solidly mounted membrane resonators, FBARs, SM-FBARs, or some other type of acoustic wave resonators. All of the acoustic wave resonators X1 to X6 are typically the same type of resonator. For ease of preparation of the figure, all of the resonators X1-X6 are the same size in FIG. 5. This is almost certainly not the case in an actual filter.

The acoustic wave resonators X1-X6 are interconnected by conductors, such as conductor 530, formed on the substrate 510. The filter 500 is electrically connected to a system external to the filter by means of pads, such as pad 520. Each pad may, for example, be or interface with a solder or gold bump to connect with a circuit board (not shown). In addition to establishing electrical connections, the pads and bumps are typically the primary means to remove heat from the filter 500.

When multiple acoustic wave resonators are formed on the same chip, the fabrication processes and material stack are inherently the same for all of the multiple resonators. In particular, the piezoelectric element (i.e. the plate, wafer, or film of piezoelectric material) within the material stack is the same for all resonators. However, the requirements on shunt resonators and series resonators are typically different, as summarized in the following table:

| Shunt Resonators | Series Resonators |
|---|---|
| High Q at resonance frequency | High Q at anti-resonance frequency |
| Low temperature coefficient of frequency at resonance frequency | Low temperature coefficient of frequency at anti-resonance frequency |
| Lower resonance frequency | Higher resonance frequency |
| Higher capacitance | Lower capacitance |
| Lower power dissipation | Higher power dissipation |

It may not be possible to select a material stack that is optimum, or even adequate, for all of the resonators in a filter.

Figure 6:
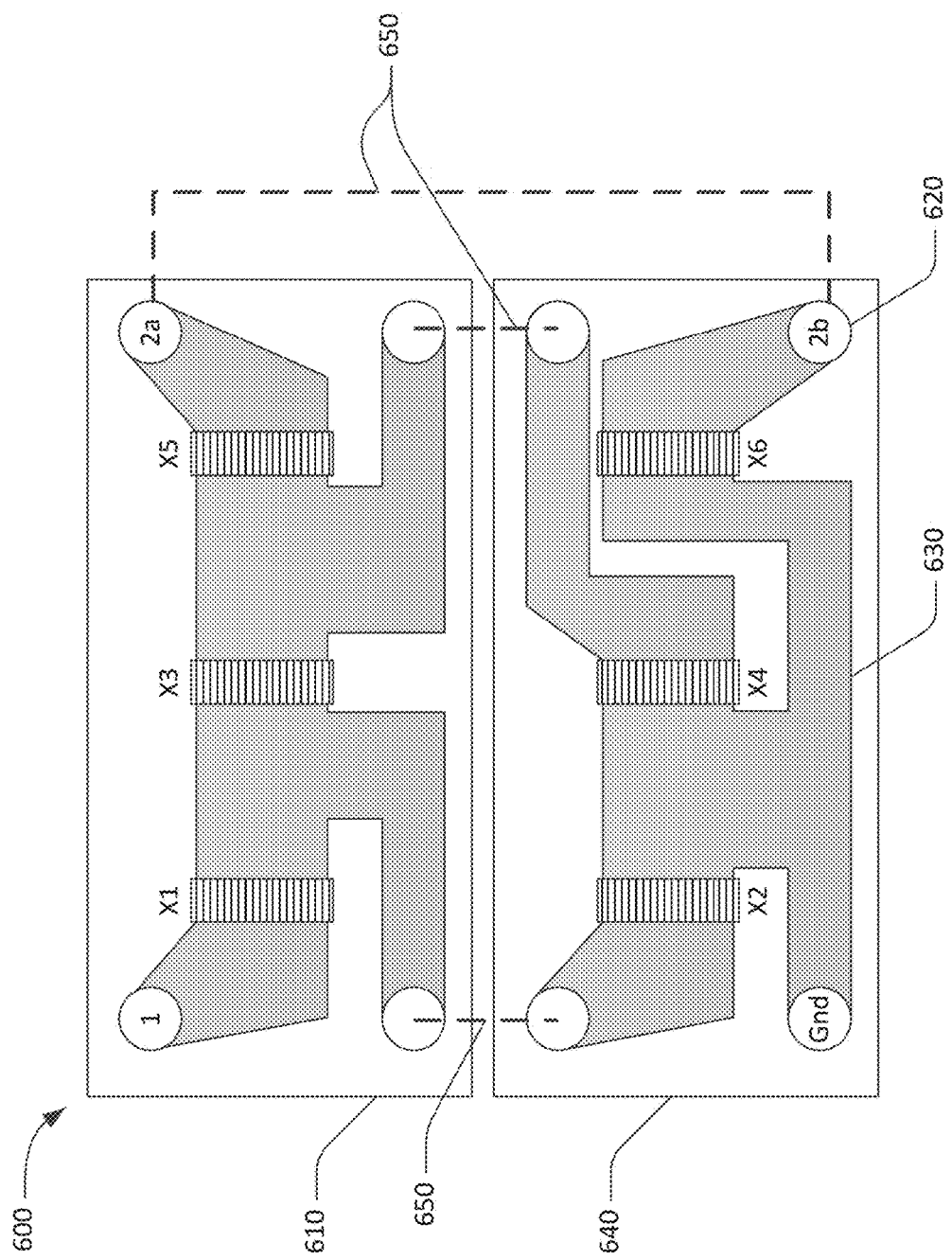
FIG. 6 is a simplified schematic plan view of a split ladder implementation of a band-pass filter.

FIG. 6 is an exemplary schematic plan view of a split ladder filter 600, which has the same schematic diagram as the ladder filter circuit 100 of FIG. 1A. In contrast to the conventional filter 500 shown in FIG. 5, the series resonators X1, X3, X5 of the split ladder filter 600 are fabricated on a first chip 610 and the shunt resonators X2, X4, X6 of the split ladder filter 600 are on fabricated on a second chip 640. Within each chip 610, 640, the acoustic wave resonators are interconnected by conductors, such as conductor 630, formed on the respective chip. The chips 610, 640 are electrically connected to each other and to a system external to the filter by means of pads, such as pad 620. Each pad may, for example, be, or interface with, a solder or gold bump to connect with a circuit card (not shown).

Electrical connections 650 between the series resonators on the first chip 610 and the shunt resonators on the second chip 640 are shown as bold dashed lines. The connections 650 are made, for example, by conductors on a circuit card to which the first and second chips are mounted. In this context, the term "circuit card" means an essentially planar structure containing conductors to connect the first and second chips to each other and to a system external to the band-pass filter 600. The circuit card may be, for example, a single-layer or multi-layer printed wiring board, a low temperature co-fired ceramic (LTCC) card, or some other type of circuit card. Traces on the circuit card can have very low resistance such that losses in the traces are negligible. The inductance of the electrical connections 650 between the series and shunt resonators can be compensated in the design of the acoustic wave resonators. In some cases, the inductance of the electrical connections 650 can be exploited to improve the performance of the filter, for example by lowering the resonance frequency of one or more shunt resonators to increase the filter bandwidth.

In the exemplary split ladder filter 600, all of the series resonators are on the first chip and all of the shunt resonators are on the second chip. However, this is not necessarily the case. In some filters, the first chip may contain less than all of the series resonators and/or the second chip may contain less than all of the shunt resonators.

Figure 7:
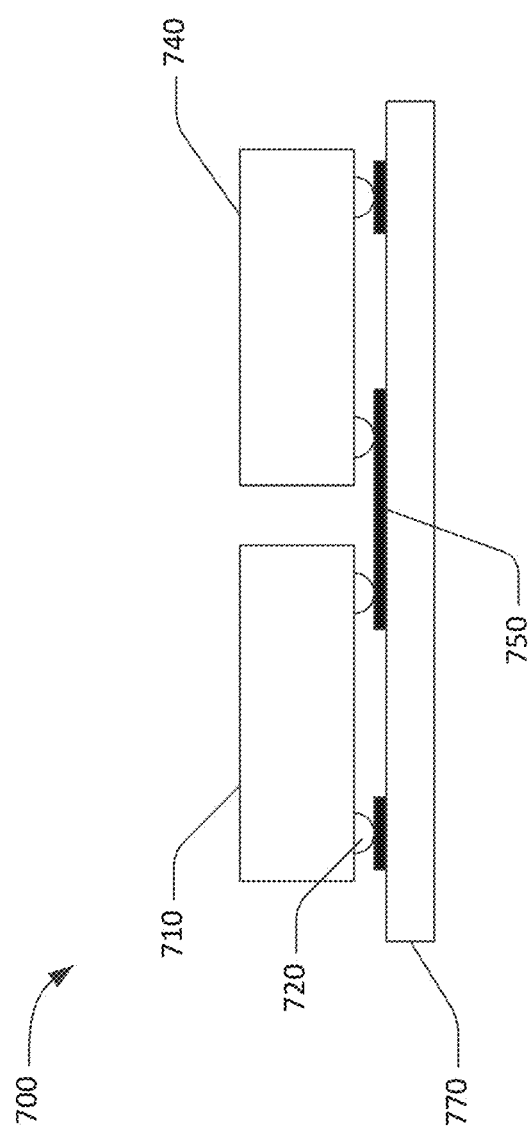
FIG. 7 is a simplified schematic cross-sectional view of a split ladder implementation of the exemplary band-pass filter of FIG. 6.

FIG. 7 is a schematic cross-sectional view of a split ladder filter 700 which may be the split ladder filter 600. The split ladder filter 700 includes a first chip 710 and a second chip 740 attached to, and interconnected by, a circuit card 770. In this example, the first and second chips 710, 740 are "flip-chip" mounted to the circuit card 770. Electrical connections between the first and second chips, 710, 740 and the circuit card 770 are made by solder or gold bumps, such as bump 720. Electrical connections between the first chip 710 and the second chip 740 are made by conductors, such as conductor 750, on or within the circuit card 770. The first and second chips 710, 740 may be mounted on and/or connected to the circuit card 770 in some other manner.

The benefit of a split ladder filter, such as the split ladder filters 600 and 700, is different material stacks can be used for the series resonators and the shunt resonators. A first material stack may be used for the first chip containing some or all series resonators and a second material stack may be used for a second chip containing some or all shunt resonators. The first and second material stacks may be different. This allows separate optimization of the first and second material stacks for series resonators and shunt resonators.

Two material stacks are considered different if they differ in at least one aspect of at least one element within the stacks. The difference between material stacks may be, for example, the sequence of the elements or a different material type, thickness, or other parameter for at least one element in the stack. Commonly, the first material stack includes a first piezoelectric element and the second material stack includes a second piezoelectric element which differs from the first piezoelectric element in at least one of a material, a thickness, and an orientation of the crystalline axes of the material.

When the split ladder filters 600/700 incorporate non-bonded SAW resonators as shown in FIG. 2A, the first material stack and the second material stack may differ in one or more of the following characteristics: the material type, thickness, and orientation of the crystalline axes of the piezoelectric plate 205; the material and/or thickness h of the conductor pattern 210; and the thickness td1 and material of the dielectric layer 215.

When the split ladder filters 600/700 incorporate bonded wafer resonators as shown in FIG. 2B, the first material stack and the second material stack may differ in one or more of the following characteristics: the material and thickness of the base 230; the number of underlying dielectric layers 240, if any, and the material and thickness td2 of each layer; the material type, thickness tp, and orientation of the crystalline axes of the piezoelectric wafer 225; the thickness h and material of the conductor pattern 235; and the thickness td1 and material of the dielectric layer 245.

When the split ladder filters 600/700 incorporate floating diaphragm resonators as shown in FIG. 3A, the first material stack and the second material stack may differ in one or more of the following characteristics: the material and thickness of the base 315; the number of underlying dielectric layers 320, if any, and the material and thickness td2 of each layer; the material type, thickness tp, and orientation of the crystalline axes of the piezoelectric wafer 310; the thickness h and material of the conductor pattern 305; and the thickness td1 and material of the dielectric layer 325.

When the split ladder filters 600/700 incorporate solidly mounted membrane resonators as shown in FIG. 3B, the first material stack and the second material stack may differ in one or more of the following characteristics: the material and thickness of the base 365; the number layers and the material and thickness of each layer in the acoustic Bragg reflector 370; the material type, thickness tp, and orientation of the crystalline axes of the piezoelectric wafer 360; the thickness h and material of the conductor pattern 365; and the thickness td1 and material of the dielectric layer 375.

When the split ladder filters 600/700 incorporate FBARs as shown in FIG. 4A, the first material stack and the second material stack may differ in one or more of the following characteristics: the material and thickness of the base 410; the material and thickness of the lower conductor 415; the material type, thickness tp, and orientation of the crystalline axes of the piezoelectric wafer 405; and the thickness and material of the upper conductor 420.

When the split ladder filters 600/700 incorporate SM-FBARs as shown in FIG. 4B, the first material stack and the second material stack may differ in one or more of the following characteristics: the material and thickness of the base 460; the number layers and the material and thickness of each layer in the acoustic Bragg reflector 475; the material and thickness of the lower conductor 465; the material type, thickness tp, and orientation of the crystalline axes of the piezoelectric wafer 455; and the thickness and material of the upper conductor 470.

The differences between the first material stack and the second material stack of a split ladder filter are not necessarily identified in the preceding six paragraphs. The first material stack and the second material stack may differ in one or more parameters in addition to, or instead of, the parameters identified herein. The types of resonators are not limited to the types illustrated in FIG. 2A through FIG. 4B. Further, the series resonators and the shunt resonators need not be the same type of resonator.

Example 1

A desired characteristic of filters for use in portable devices is stability of the filter passband over a wide range of temperatures. A technology to achieve, at least in part, that objective is to fabricate the filter with bonded-wafer resonators using a thin wafer of piezoelectric material bonded to a base, such as a silicon substrate, that has a low thermal expansion coefficient and high thermal conductivity. A bonded-wafer SAW filter will have lower temperature rise for a given power input and reduced sensitivity of the passband frequency to temperature compared to a filter using non-bonded SAW resonators.

A disadvantage of bonded-wafer SAW resonators is the presence of spurious acoustic modes that can propagate within the piezoelectric material or into the silicon wafer or other base. A key element of the design of a bandpass filter using bonded-wafer resonators is to ensure that the spurious modes occur at frequencies away from the filter passband. The cross-sectional structure and material stack for a bonded-wafer SAW resonator is similar to the resonator 250 of FIG. 2B.

Figure 8:
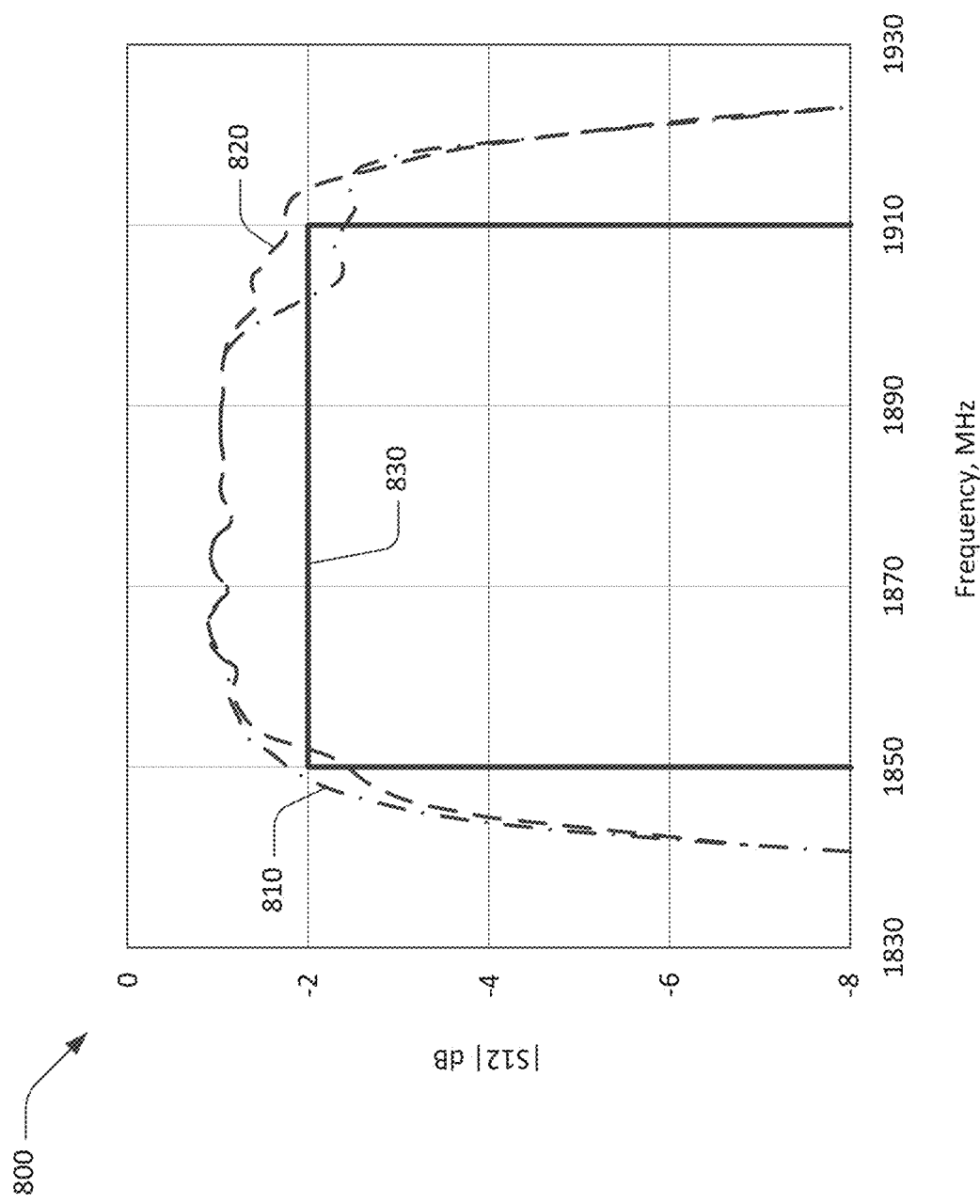
FIG. 8 is a chart comparing S12 of two implementations of an exemplary band-pass filter.

FIG. 8 is a graph 800 of the magnitude of S12 for two bonded-wafer SAW filters fabricated using lithium tantalate (LT) wafers bonded to silicon bases. S12 is the transmission between the first and second ports of the filter. The dot-dash line 810 is a plot of S12 for a filter fabricated on a 42-degree Y-cut LT wafer. The dashed line 820 is a plot of S12 for a filter fabricated on a 46-degree Y-cut LT wafer. The bold line 830 defines a requirement (less than 2 dB insertion loss over the transmission band from 1850 MHz to 1910 MHz) for an LTE (Long Term Evolution) Band 2 transmit filter.

When the filter is fabricated on 42-degree LT (dot-dash line 810), spurious modes occur at frequencies around the anti-resonance frequencies of the series resonators in the filter. These spurious modes reduce S12 (and correspondingly increase insertion loss) near the upper edge of the filter passband, between 1902 MHz and 1915 MHz. When the filter is fabricated on 46-degree LT (dashed line 820), spurious modes occur at frequencies around the resonance frequencies of the shunt resonators. These spurious modes reduce S12 (and correspondingly increase insertion loss) between 1845 MHz and 1855 MHz. Neither of these filters meets the requirement of less than 2 dB insertion loss over the LTE Band 2 transmission band.

Figure 9:
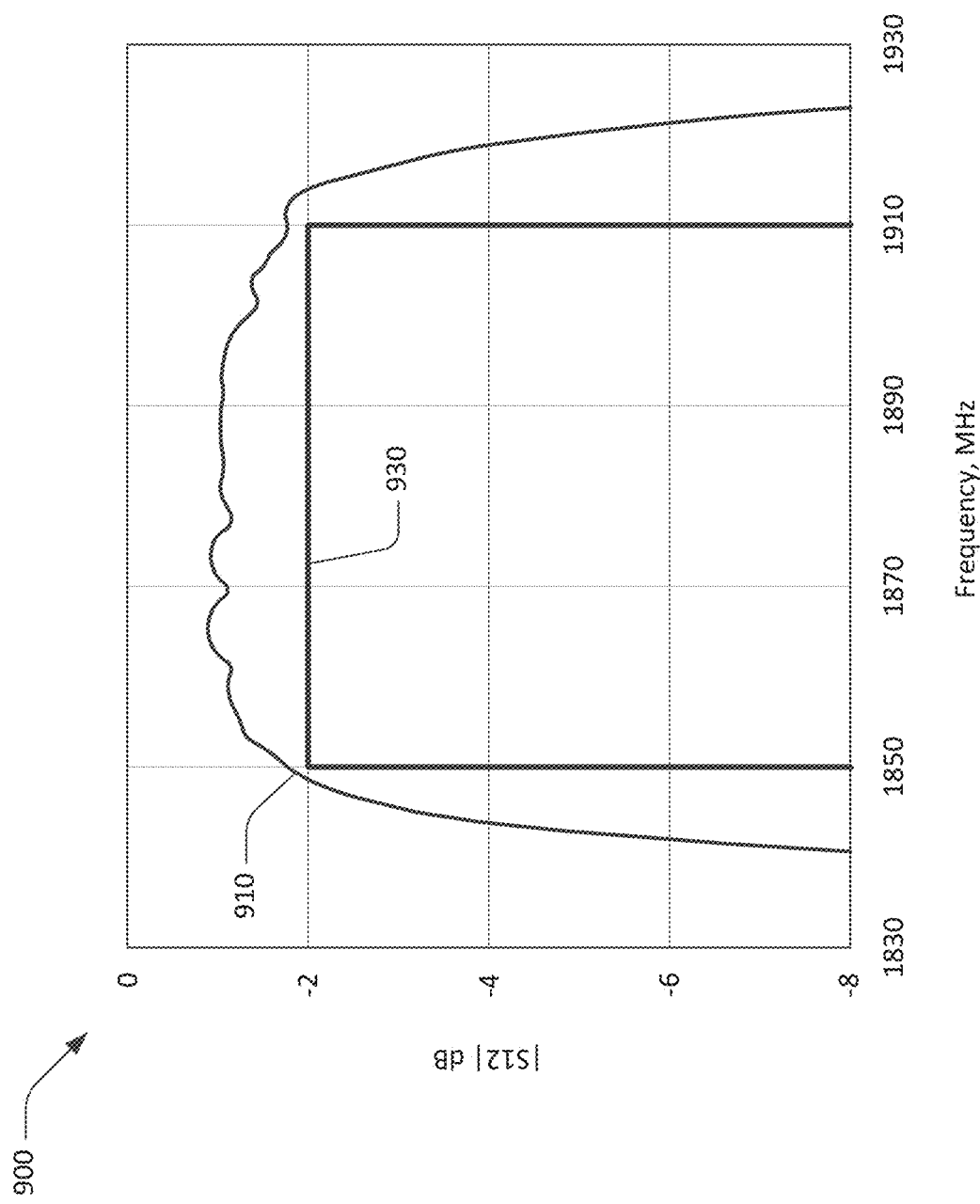
FIG. 9 is a chart of S12 of a split ladder implementation of the exemplary band-pass filter.

FIG. 9 is a graph 900 of the magnitude of S12 (curve 910) for a split-ladder LTE Band 2 transmit filter fabricated on two chips, each of which has a lithium tantalate (LT) wafer bonded to a silicon base. The first chip contains series resonators fabricated on 46-degree LT. The second chip contains shunt resonators fabricated on 42-degree LT. The material stacks for the first chip and the second chip differ by at least the orientation of the crystalline axis of the respective LT wafers and may differ in other ways.

Using 46-degree LT for the series resonators avoids the losses at the upper edge of the passband due to spurious modes that were evident in the curve 810. Using 42-degree LT for the shunt resonators avoids the losses at the lower edge of the passband due to spurious modes that were evident in the curve 820. As shown in FIG. 9, the split ladder filter meets the LTE Band 2 transmit filter insertion loss requirement (bold line 930), in contrast to the performance of either conventional (i.e. single-chip) ladder filter shown in FIG. 8.

Example 2

For most acoustic wave resonators, increasing temperature causes both the resonance and anti-resonance frequencies to shift to a lower frequency. A reduction in the resonance frequency of shunt resonators increases the margin between the lower edge of the filter passband and the lower edge of the actual frequency band. Thus the impact of temperature on shunt resonators may be small. Conversely, a reduction in the anti-resonance frequency of series resonators reduces the margin between the upper edge of the filter passband and the upper edge of the actual frequency band. This effect may be accompanied by increased power dissipation in the series resonators. Thus the benefits of bonded-wafer resonators (low temperature coefficient of frequency and high thermal conductivity to limit temperature rise) are more significant for series resonators than for shunt resonators. A split-ladder filter including a first chip with bonded-wafer series resonators and a second chip with non-bonded SAW shunt resonators provides lower cost than the previous Example 1 while maintaining the benefits of using bonded-wafer series resonators.

Example 3

Many of the frequency bands used by portable communications devices are "frequency division duplex" (FDD) bands, which is to say separate frequency ranges or bands are used for signals transmitted from and received by the device. A duplexer is a filter subsystem to separate the transmit frequency band from the receive frequency band. Typically, a duplexer includes a transmit filter that accepts a transmit signal from a transmitter and delivers a filtered transmit signal to an antenna, and a receive filter that accepts a receive signal from the antenna and delivers a filtered receive signal to a receiver.

A duplexer may be implemented as two filters on a common chip using the same material stack for both the transmit filter and the receive filter. Alternatively, a duplexer 1000 may be implemented with the transmit filter and receive filter on separate chips, as shown in FIG. 10A. A first chip 1010 contains the transmit filter and a second chip 1020 contains the receive filter. Pads on the chips 1010, 1020 connect to a circuit card as previously described. The pad labels "Tx" is the input from a transmitter. The pad labeled "Rx" is the output to a receiver. Pads labeled "A" connect to an antenna. Pads labeled "G" connect to ground. FIG. 10A illustrates the concept of a two-chip duplexer rather than a specific duplexer design. For ease of preparation, the transmit filter on the first chip 1010 is the same as the filter shown in FIG. 5 and the receive filter on the second chip 1020 is a mirror image of the filter of FIG. 5.

Implementing a duplexer with the transmit filter and receive filter on different chips allows the material stack for the two filters to be different. Two-chip implementations may be appropriate for frequency division duplex bands where the transmit and receive frequency bands are widely separated. For example, LTE band 4 has 400 MHz separation between the transmit band (1710 MHz to 1755 MHz) and the receive band (2110 MHz to 2155 MHz). Implementing a LTE band 4 duplexer with the transmit filter and receive filter on different chips allows the material stack for the two filters to be optimized for the respective frequency ranges.

Figure 10B:
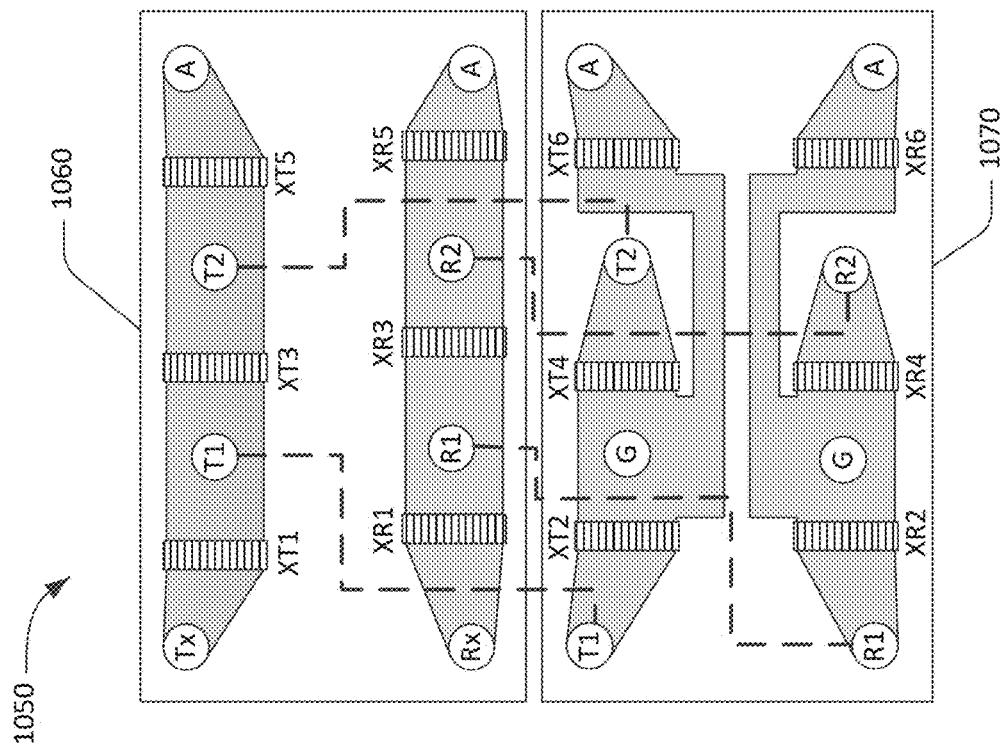
FIG. 10B is a simplified schematic plan view of a split ladder implementation of a duplexer.
Figure 10A:
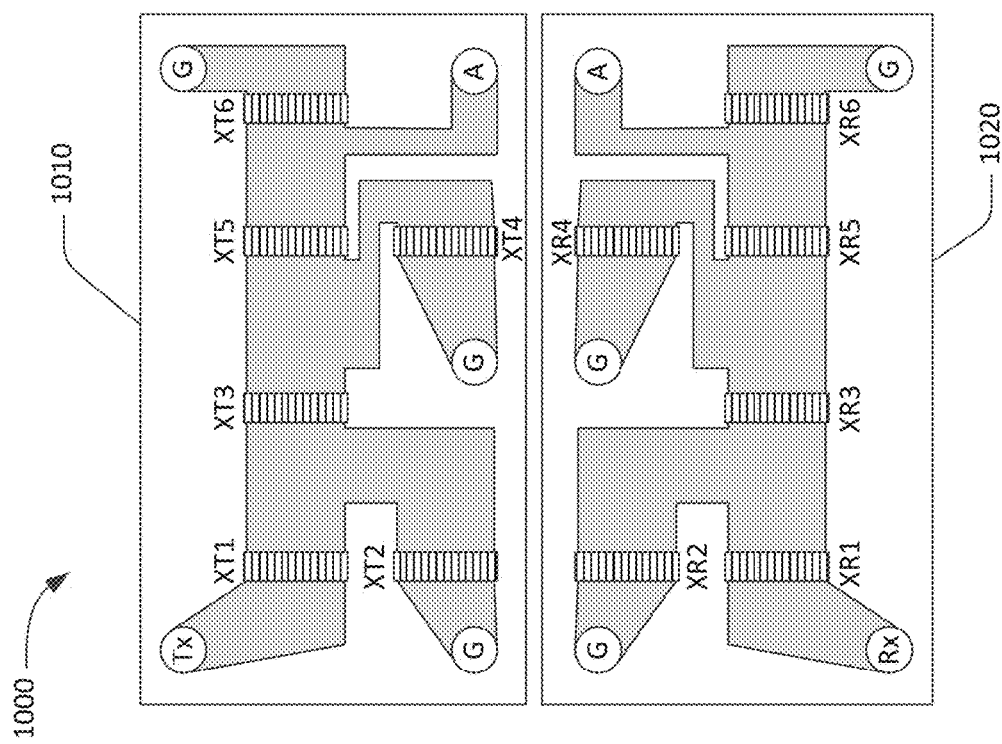
FIG. 10A is a simplified schematic plan view of a two-chip duplexer.

FIG. 10B is an exemplary schematic plan view of a split ladder duplexer 1050 including a transmit filter and a receive filter, each of which has the same schematic diagram as the band-pass filter circuit 100 of FIG. 1. The transmit filter includes series resonators XT1, XT3, and XT5 and shunt resonators XT2, XT4, and XT6. The receive filter includes series resonators XR1, XR3, and XR5 and shunt resonators XR2, XR4, and XR6. In contrast to the two-chip duplexer 1000 shown in FIG. 10A, the series resonators XT1, XT3, XT5, XR1, XR3, XR5 of both the transmit filter and the receive filter are fabricated on a first chip 1060. The shunt resonators XT2, XT4, XT6, XR2, XR4, XR6 of both the transmit filter and the receive filter are fabricated on a second chip 1070. The chips 1060, 1070 are electrically connected to each other and to a system external to the filter by means of pads and as a circuit card as previously described. Each pad may, for example, be, or interface with, a solder or gold bump to connect with on the circuit card (not shown). Electrical connections 650 between the series resonators on the first chip 1060 and the shunt resonators on the second chip 1070 are shown as bold dashed lines. The connections 650 are made, for example, by conductors on the circuit card to which the first and second chips 1060, 1070 are mounted.

The transmit filter may be, for example, the LTE band 2 transmit split ladder filter described in conjunction with FIG. 8 and FIG. 9. The receive filter may be similar to the split ladder filter with a passband from 1930 MHz to 1990 MHz.

Example 4

Figure 11:
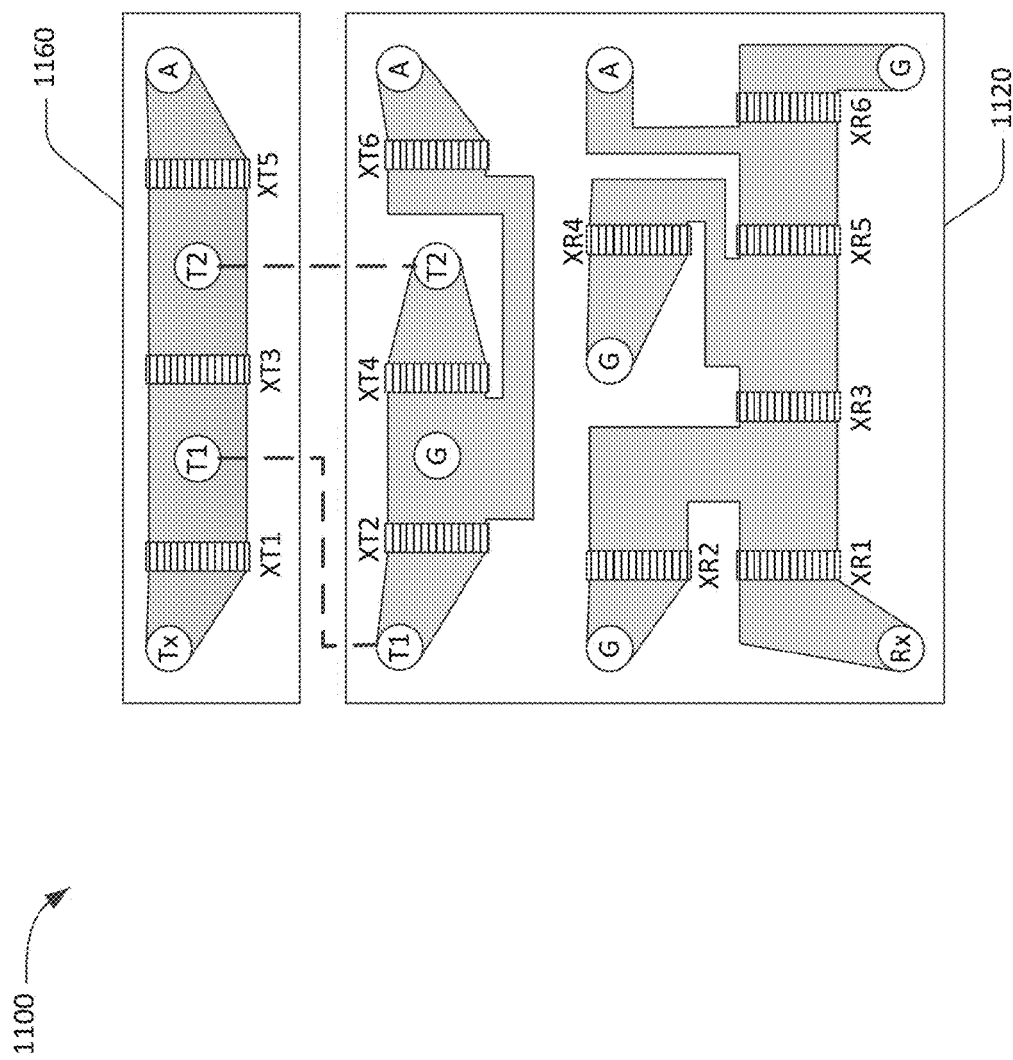
FIG. 11 is a simplified schematic plan view of another split ladder implementation of a duplexer.

FIG. 11 is an exemplary schematic plan view of another split ladder duplexer 1100 including a transmit filter and a receive filter, each of which has the same schematic diagram as the band-pass filter circuit 100 of FIG. 1. The transmit filter includes series resonators XT1, XT3, and XT5 and shunt resonators XT2, XT4, and XT6. The receive filter includes series resonators XR1, XR3, and XR5 and shunt resonators XR2, XR4, and XR6. The series resonators XT1, XT3, XT5 of the transmit filter are fabricated on a first chip 1060. The shunt resonators XT2, XT4, XT6 of the transmit filter and all of the resonators XR1, XR2, XR3, XR4, XR5, XR6 of the receive filter are fabricated on a second chip 1070. The chips 1060, 1070 are electrically connected to each other and to a system external to the filter by means of pads and as a circuit card as previously described.

The series resonators XT1, XT3, XT5 of the transmit filter on the first chip 1160 have high power dissipation compared to the resonators on the second chip 1120. Thus, the first chip may have a material stack that provides efficient heat removal from the resonators. The series resonators XT1, XT3, XT5 of the transmit filter may be, for example, bonded wafer resonators or solidly mounted membrane resonators. The second chip, where heat removal is not as significant, may be fabricated using a different type of resonator. The resonators on the second chip may be, for example, non-bonded SAW resonators.

Description of Methods

Figure 12:
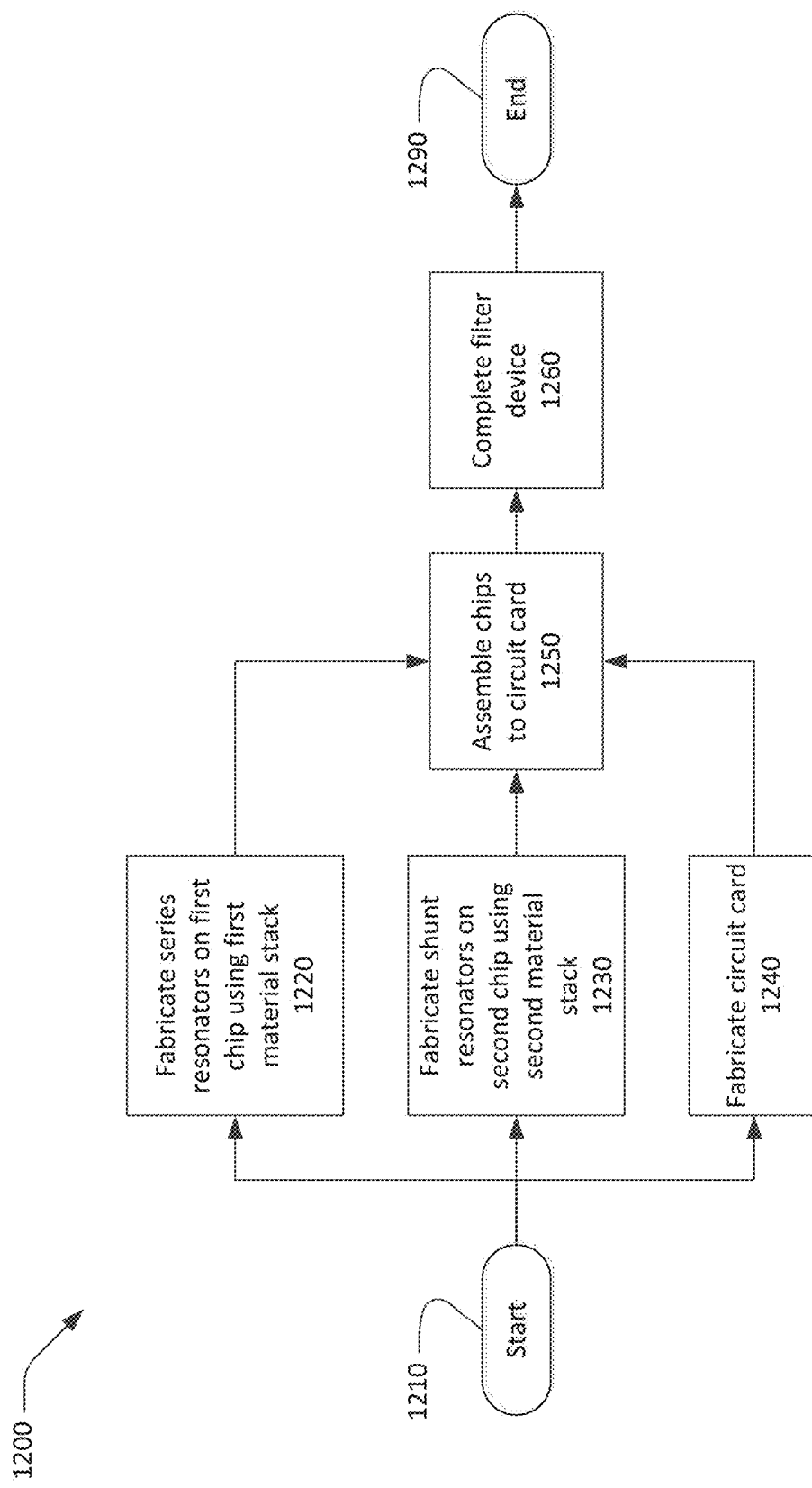
FIG. 12 is a flow chart of a method for fabricating a split ladder filter device.

FIG. 12 is a flow chart of a method 1200 for fabricating a split-ladder filter device, which may be the split ladder filter devices 600, 700, or 1050. The method 1200 starts at 1210 and concludes at 1290 with a completed filter device.

At 1220, a first chip is fabricated using a first material stack. The first chip contains one, some, or all of the series resonators of the filter device. The first chip may be a portion of a first large multi-chip wafer such that multiple copies of the first chip are produced during each repetition of the step 1220. In this case, individual chips may be excised from the wafer and tested as part of the action at 1220.

At 1230, a second chip is fabricated using a second material stack that is different from the first material stack. The second chip contains one, some, or all of the shunt resonators of the filter device. The second chip may be a portion of a second large multi-chip wafer such that multiple copies of the second chip are produced during each repetition of the step 1230. In this case, individual chips may be excised from the wafer and tested as part of the action at 1230.

At 1240, a circuit card is fabricated. The circuit card may be, for example, a printed wiring board or an LTCC card or some other form of circuit card. The circuit card may include one or more conductors for making at least one electrical connection between a series resonator on the first chip and a shunt resonator on the second chip. The circuit may be a portion of large substrate such that multiple copies of the circuit card are produced during each repetition of the step 1240. In this case, individual circuit cards may be excised from the substrate and tested as part of the action at 1240. Alternatively, individual circuit cards may be excised from the substrate after chips have been attached to the circuit cards at 1250, or after the devices are packaged at 1260.

At 1250, individual first and second chips are assembled to a circuit card (which may or may not be a portion of a larger substrate) using known processes. For example, the first and second chips may be "flip-chip" mounted to the circuit card using solder or gold bumps or balls to make electrical, mechanical, and thermal connections between the chips and the circuit card. The first and second chips may be assembled to the circuit card in some other manner.

The filter device is completed at 1260. Completing the filter device at 1260 includes packaging and testing. Completing the filter device at 1260 may include excising individual circuit card/chip assemblies from a larger substrate before or after packaging.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A filter device, comprising:
   a first chip comprising:
      a first interdigital transducer (IDT) of a first acoustic resonator formed on a surface of a first piezoelectric wafer having a first thickness, interleaved fingers of the first IDT disposed on a portion of the first piezoelectric wafer spanning a first cavity in a first base;
   a second chip comprising:
      a second IDT of a second acoustic resonator formed on a surface of a second piezoelectric wafer having a second thickness less than the first thickness, interleaved fingers of the second IDT disposed on a portion of the second piezoelectric wafer spanning a second cavity in a second base; and
   a circuit card coupled to the first chip and the second chip, the circuit card comprising at least one conductor for making an electrical connection between the first IDT and the second IDT, wherein
   a thickness of the interleaved fingers of the first IDT is different from a thickness of the interleaved fingers of the second IDT.

2. The filter device of claim 1, wherein
   the first piezoelectric wafer and the second piezoelectric wafer comprise one of lithium niobate and lithium tantalate.

3. A filter device, comprising:
   a first chip comprising:
      a first piezoelectric wafer having a first thickness, a back surface of the first piezoelectric wafer attached to a first base, and
      a first conductor pattern formed on a front surface of the first piezoelectric wafer, the first conductor pattern including interdigital transducers (IDTs) of one or more first acoustic resonators, interleaved IDT fingers of each of the IDTs of the one or more first acoustic resonators disposed on respective diaphragms suspended over respective cavities formed in the first base;

a second chip comprising:
  a second piezoelectric wafer having a second thickness less than the first thickness, a back surface of the second piezoelectric wafer attached to a second base, and
  a second conductor pattern formed on a front surface of the second piezoelectric wafer, the second conductor pattern including interdigital transducers (IDTs) of one or more second acoustic resonators, interleaved IDT fingers of each of the one or more second acoustic resonators disposed on respective diaphragms suspended over respective cavities formed in the second base; and
  a circuit card coupled to the first chip and the second chip, the circuit card comprising at least one conductor for making an electrical connection between one of the one or more first acoustic resonators and one of the one or more second acoustic resonators, wherein an orientation of crystalline axes of the first piezoelectric wafer is different from an orientation of crystalline axes of the second piezoelectric wafer.

4. A filter device, comprising:
a first chip comprising:
  a first interdigital transducer (IDT) of a first acoustic resonator formed on a surface of a first piezoelectric wafer having a first thickness, interleaved fingers of the first IDT disposed on a portion of the first piezoelectric wafer spanning a first cavity in a first base;
a second chip comprising:
  a second IDT of a second acoustic resonator formed on a surface of a second piezoelectric wafer having a second thickness less than the first thickness, interleaved fingers of the second IDT disposed on a portion of the second piezoelectric wafer spanning a second cavity in a second base; and
  a circuit card coupled to the first chip and the second chip, the circuit card comprising at least one conductor for making an electrical connection between the first IDT and the second IDT, wherein
an orientation of crystalline axes of the first piezoelectric wafer is different from an orientation of crystalline axes of the second piezoelectric wafer.

5. A filter device, comprising:
a first chip comprising:
  a first interdigital transducer (IDT) of a first acoustic resonator formed on a surface of a first piezoelectric wafer having a first thickness, interleaved fingers of the first IDT disposed on a portion of the first piezoelectric wafer spanning a first cavity in a first base;
a second chip comprising:
  a second IDT of a second acoustic resonator formed on a surface of a second piezoelectric wafer having a second thickness less than the first thickness, interleaved fingers of the second IDT disposed on a portion of the second piezoelectric wafer spanning a second cavity in a second base; and
  a circuit card coupled to the first chip and the second chip, the circuit card comprising at least one conductor for making an electrical connection between the first IDT and the second IDT, wherein
the first chip, the second chip, and the circuit card collectively form a ladder filter circuit.

6. The filter device of claim 5, wherein
the first acoustic resonator is a shunt resonator in the ladder filter circuit, and
the second acoustic resonator is a series resonator in the ladder filter circuit.

7. The filter device of claim 6, wherein
the first chip comprises one or more additional shunt resonators of the ladder filter circuit, and
the second chip comprised one or more additional series resonators of the ladder filter circuit.

8. A filter device, comprising:
a first chip comprising:
  a first piezoelectric wafer having a first thickness, a back surface of the first piezoelectric wafer attached to a first base, and
  a first conductor pattern formed on a front surface of the first piezoelectric wafer, the first conductor pattern including interdigital transducers (IDTs) of one or more first acoustic resonators, interleaved IDT fingers of each of the IDTs of the one or more first acoustic resonators disposed on respective diaphragms suspended over respective cavities formed in the first base;
a second chip comprising:
  a second piezoelectric wafer having a second thickness less than the first thickness, a back surface of the second piezoelectric wafer attached to a second base, and
  a second conductor pattern formed on a front surface of the second piezoelectric wafer, the second conductor pattern including interdigital transducers (IDTs) of one or more second acoustic resonators, interleaved IDT fingers of each of the one or more second acoustic resonators disposed on respective diaphragms suspended over respective cavities formed in the second base; and
a circuit card coupled to the first chip and the second chip, the circuit card comprising at least one conductor for making an electrical connection between one of the one or more first acoustic resonators and one of the one or more second acoustic resonators, wherein
a thickness of the first conductor pattern is different from a thickness of the second conductor pattern.

9. The filter device of claim 8, wherein
the first piezoelectric wafer and the second piezoelectric wafer comprise one of lithium niobate and lithium tantalate.

10. A filter device, comprising:
a first chip comprising:
  a first piezoelectric wafer having a first thickness, a back surface of the first piezoelectric wafer attached to a first base, and
  a first conductor pattern formed on a front surface of the first piezoelectric wafer, the first conductor pattern including interdigital transducers (IDTs) of one or more first acoustic resonators, interleaved IDT fingers of each of the IDTs of the one or more first acoustic resonators disposed on respective diaphragms suspended over respective cavities formed in the first base;
a second chip comprising:
  a second piezoelectric wafer having a second thickness less than the first thickness, a back surface of the second piezoelectric wafer attached to a second base, and a second conductor pattern formed on a front surface of the second piezoelectric wafer, the second conductor pattern including interdigital transducers (IDTs) of one or more second acoustic resonators, interleaved IDT fingers of each of the one or more second acoustic resonators disposed on respective diaphragms suspended over respective cavities formed in the second base; and a circuit card coupled to the first chip and the second chip, the circuit card comprising at least one conductor for making an electrical connection between one of the one or more first acoustic resonators and one of the one or more second acoustic resonators, wherein the first chip, the second chip, and the circuit card collectively form a ladder filter circuit.

11. The filter device of claim 10, wherein
the one or more first acoustic resonators are shunt resonators in the ladder filter circuit, and
the one or more second acoustic resonators are series resonators in the ladder filter circuit.

12. The filter device of claim 11, wherein
the first chip comprises all of the shunt resonators in the ladder filter circuit, and
the second chip comprises all of the series resonators in the ladder filter circuit.

13. A filter device, comprising:
a first chip comprising a first floating diaphragm resonator, the first floating diaphragm resonator comprising:
  a first diaphragm of single-crystal piezoelectric material floating over a first cavity in a first base, and
  a first interdigital transducer (IDT), interleaved fingers of the first IDT disposed on the first diaphragm;
a second chip comprising a second floating diaphragm resonator, the second floating diaphragm resonator comprising:
  a second diaphragm of single-crystal piezoelectric material floating over a second cavity in a second base, and
  a second IDT, interleaved fingers of the second IDT disposed on the second diaphragm; and
a circuit card coupled to the first chip and the second chip, the circuit card comprising at least one conductor for making an electrical connection between the first floating diaphragm resonator and the second floating diaphragm resonator, wherein
a thickness of the first diaphragm is greater than a thickness of the second diaphragm.

14. The filter device of claim 13, wherein
the first diaphragm and the second diaphragm comprise one of lithium niobate and lithium tantalate.

15. The filter device of claim 13, wherein
a thickness of the interleaved fingers of the first IDT is different from a thickness of the interleaved fingers of the second IDT.

16. The filter device of claim 13, wherein
an orientation of crystalline axes of the first diaphragm is different from an orientation of crystalline axes of the second diaphragm.

17. The filter device of claim 13, wherein
the first chip, the second chip, and the circuit card collectively form a ladder filter circuit.

18. The filter device of claim 17, wherein
the first floating diaphragm resonator is a shunt resonator in the ladder filter circuit, and
the second floating diaphragm resonator is a series resonator in the ladder filter circuit.

19. The filter device of claim 17, wherein
the first chip comprises all shunt resonators of the ladder filter circuit, and
the second chip comprises all series resonators of the ladder filter circuit.

* * * * *